United States Patent
Maa et al.

[11] Patent Number: 5,814,537
[45] Date of Patent: Sep. 29, 1998

[54] METHOD OF FORMING TRANSISTOR ELECTRODES FROM DIRECTIONALLY DEPOSITED SILICIDE

[75] Inventors: Jer-shen Maa, Vancouver; Sheng Teng Hsu, Camas, both of Wash.

[73] Assignees: Sharp Microelectronics Technology,Inc., Camas, Wash.; Sharp Kabushiki Kaisha, Osaka, Japan

[21] Appl. No.: 768,647

[22] Filed: Dec. 18, 1996

[51] Int. Cl.$^6$ .................. H01L 21/336; H01L 21/285
[52] U.S. Cl. .................. 438/151; 438/164; 438/303; 438/655; 438/682; 438/657; 438/586; 438/595; 148/DIG. 147
[58] Field of Search ................ 438/149, 151, 438/154, 164, 301, 300, 303, 664, 682, 586, 595, 655, 657, 155, 352, 360, 182, 199; 148/DIG. 147

[56] References Cited

U.S. PATENT DOCUMENTS

| | | | |
|---|---|---|---|
| 4,716,131 | 12/1987 | Okazawa et al. | 438/655 |
| 5,242,847 | 9/1993 | Ozturk et al. | 437/41 |
| 5,316,977 | 5/1994 | Kunishima et al. | 438/655 |
| 5,449,642 | 9/1995 | Tan et al. | 438/655 |
| 5,529,958 | 6/1996 | Yaoita | 438/655 |

*Primary Examiner*—Mary Wilczewski
*Attorney, Agent, or Firm*—Gerald W. Maliszewski; David C. Ripma

[57] ABSTRACT

A method is provided for forming silicide surfaces on source, drain, and gate electrodes in active devices to decrease the resistance of the electrode surfaces, without consuming the silicon of the electrodes in the process. Silicide is directionally deposited on the electrodes so that a greater thickness accumulates on electrode surfaces, and a lesser thickness accumulates on the gate sidewall surfaces isolating the gate from the source/drain electrodes. Then, the electrodes are isotropically etched so that the lesser thickness on the sidewalls is removed, leaving at least some thickness of silicide covering the electrodes. In further steps, the electrodes are masked with photoresist, and any silicide deposited in the region of field oxide around the electrodes is removed. Conductive lines, connecting to the electrodes across the field oxide, are fabricated from polycide, which includes a level of polysilicon covered with silicide, when the lower resistance surface of a metal-disilicide overlying the conductive line is required. The method of the present invention is applicable to bulk silicon, as well as SIMOX, transistor fabrication processes. An IC structure having different thicknesses of directionally deposited silicide, and a completed MOS transistor having interim thicknesses of directionally deposited silicide, are also provided.

14 Claims, 6 Drawing Sheets

Fig. 1
(PRIOT ART)

Fig. 2
(PRIOT ART)

Fig. 3
(PRIOT ART)

Fig. 4
(PRIOT ART)

METHOD OF FORMING TRANSISTOR ELECTRODES FROM DIRECTIONALLY DEPOSITED SILICIDE

BACKGROUND AND SUMMARY OF THE INVENTION

The invention relates generally to semiconductor technology and more particularly to the formation of silicided electrodes in active semiconductor devices, such as MOS transistors.

An important subject of ongoing research in the semiconductor industry is the reduction in the dimensions of devices used in integrated circuits. Planar transistors such as metal oxide semiconductor (MOS) transistors are particularly suited to use in high density integrated circuits. As the size of MOS transistors and other active devices decreases, the dimensions of the source/drain/gate electrodes, and the channel region of each device, decrease correspondingly.

The design of ever smaller planar transistors with short channel lengths makes it necessary to provide very shallow source/drain junction regions. Shallow junctions are necessary to avoid lateral diffusion of implantation dopants into the channel, such diffusion being undesirable because it contributes to leakage currents and poor breakdown performance. Shallow source/drain junction regions, for example, less than 1000 angstroms (Å) thick, and preferably less than 500 Å thick, are necessary for acceptable performance in short channel devices.

When shallow junction electrodes are used in transistors, it becomes more difficult to provide reliable, low resistance connections to the source/drain regions of the device. Metal-silicide contacts are a typical means of effecting such connections to source/drain/gate electrodes. In such contacts conductive metal is deposited on the silicon electrodes and annealed to form a metal-silicon compound on the surface of the electrodes. The compound, called silicide, is electrically and physically bonded to the electrode, and has a substantially lower sheet resistance than the doped silicon on which it is formed. An important advantage of silicide contacts in small devices is that silicide is only formed where the deposited metal is in contact with silicon. By means of a selective etch the metal is readily removed from the non-silicided areas. Thus, the silicide regions are automatically aligned on the electrode surfaces only. This self-aligned silicide process is generally referred to as the "salicide" process.

The difficulty presented by the salicide process on shallow junction source and drain regions is that it consumes a portion of the surface silicon. The metal-silicide is formed from a chemical reaction which occurs during an annealing step, when the deposited metal reacts with the underlying silicon. Electrodes with very thin junction depths have less silicon to sacrifice to the formation silicide and can only permit a very thin layer of silicide to be formed. But thin silicide films are known to be thermally unstable and have an undesirably high sheet resistance.

One prior art technique for increasing the thickness of the silicide contacts is to deposit additional silicon on the surface of the doped source and drain regions. The additional silicon in the raised source and drain electrodes can then be used in the reaction with deposited metal to form thicker silicide layers. This solution has disadvantages because the deposition of additional silicon produces additional diffusion of dopants and other effects which can degrade device performance.

It would be advantageous if an improved silicide process were available to provide low sheet resistance silicide layers on shallow junction electrodes in a MOS device.

It would also be advantageous if a silicide layer could be formed on a shallow junction silicon electrode while minimizing the consumption of surface silicon by providing the majority of the required silicon from a source other than the electrode itself.

It would be advantageous if the silicon required for the silicide could be supplied in the form of a silicide layer deposited on the transistor electrodes to substantially eliminate the consumption of any silicon from the electrode surface.

Accordingly, an integrated circuit (IC) structure covered with different thicknesses of silicide, formed during the production of a MOS transistor is provided. The IC structure comprises a substrate including insulating material in an active region where the transistor is formed. The IC also comprises a source and drain electrode overlying the substrate. The source and drain electrodes are formed from silicon implanted with doping impurities which are diffused into the silicon, and the source and drain electrodes are separated by a silicon channel region. The IC also comprises a gate, including a gate insulation layer centrally disposed over the channel region, a gate electrode overlying the gate insulation layer, and gate insulation sidewalls overlying the gate insulation layer, generally surrounding the gate electrode. The gate insulation electrically isolates the gate electrode from the source and drain electrodes. Finally, the IC comprises a metal-silicide layer formed from the deposition of silicide in the collimated path which extends generally perpendicular to the source, drain, and gate electrodes, and parallel to the gate sidewalls. The silicide layer has a first thickness of silicide on the electrodes, and a second, smaller, thickness on the gate sidewalls. The isotropic removal of a predetermined thickness of the silicide layer greater than the second thickness, and less than the first thickness, in subsequent processing steps, results in a third thickness of silicide covering the source, drain, and gate electrodes to improve the conductivity of the electrodes.

In the preferred embodiment, the IC structure is a completed MOS transistor additionally comprising a first metal-disilicide layer having approximately a third thickness overlying the source, drain, and gate electrodes The first disilicide layer is formed by isotropically etching a predetermined thickness from a silicide layer first thickness, with the first thickness being formed as a result of depositing metal-silicide in a collimated path generally perpendicular to the electrodes. The transistor also comprises an interim metal-silicide layer having a second thickness overlying the gate sidewall insulation, with the second thickness being formed from the deposition of silicide in a collimated path generally parallel to the gate sidewall insulation. The interim layer is removed by isotropically etching the predetermined thickness from the second thickness, with the predetermined thickness being greater than the second thickness, but less than the first thickness. The collimated deposition, and isotropic etching, permit the selective silicidation of the source, drain, and gate electrodes.

In one embodiment, an overhang structure overlies the gate electrode. The overhang structure extends beyond the gate electrode to shelter the gate sidewalls from the deposition of silicide, when silicide is deposited in a collimated path generally perpendicular to the overhang and parallel to the gate sidewalls. The addition of the overhang structure makes the deposition of silicide on areas of the IC more selective.

The substrate includes a field area of insulating material generally surrounding the IC structure or transistor. The third thickness of metal-silicide overlies the field area, as well as the electrodes. Subsequent process steps of masking the transistor electrodes, and etching the IC to remove any remaining silicide overlying the field area, leave only the masked areas covered with silicide.

Preferably, the field area includes a polycide conductive line overlying the field area to connect an electrode of the IC structure to another region of the IC. The conductive line includes a layer of polysilicon overlying the field area, and a layer of silicide overlying the polysilicon conductive line layer. A layer of silicide remains overlying the conductive line polysilicon layer, even after the IC is etched to remove, in subsequent process steps, silicide from the field area, so that conductive areas of the IC, including the conductive line, as well as the source, drain, and gate electrodes, are covered with a layer of silicide to improve conductivity.

A method of forming a MOS transistor overlying a substrate of insulating material on an IC is also provided, comprising the steps of: a) forming source and drain electrodes of silicon overlying the substrate, forming a gate electrode with insulating sidewalls between the source and drain electrodes, and forming insulation material underneath the gate electrode, whereby the insulation electrically isolates the gate electrode from the source and drain electrodes; b) depositing metal-silicide in a collimated path, with the path generally extending perpendicular to the source, drain, and gate electrodes, and parallel to the gate sidewalls, the silicide is selectively applied to the transistor to form a layer of silicide having a first thickness overlying the electrodes and a second thickness, less than the first thickness, overlying the gate sidewall insulation material; and, c) isotropically etching the silicide layer, deposited in step b), a predetermined thickness, greater than the second thickness but less than the first thickness, to remove the layer of silicide overlying the gate sidewall insulation material, and leaving the electrodes covered with a layer of silicide having a third thickness, whereby the selective formation of silicide on the electrode surfaces increases electrode conductivity.

DETAILED DESCRIPTION OF THE PREFERRED EMBODIMENT

Figure 1:
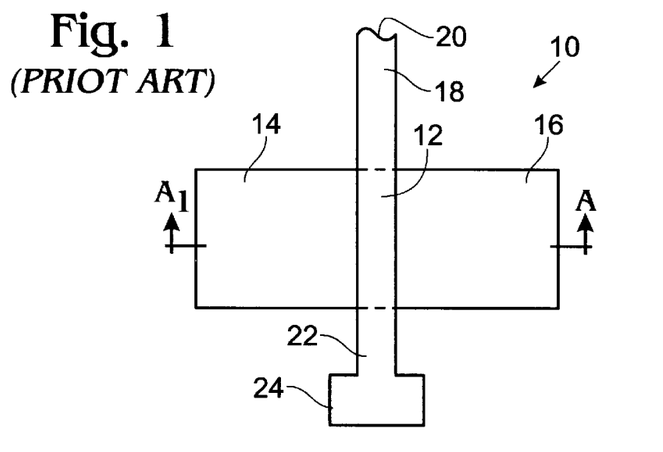
FIGS. 1 through 4 illustrate steps in the formation of silicide covered transistor electrodes (prior art).

FIGS. 1 through 4 illustrate steps in the formation of silicide covered transistor electrodes (prior art). FIG. 1 is an overview of a typical MOS transistor 10. Transistor 10 comprises a gate electrode 12, a source electrode 14, and a drain electrode 16. The positioning of source 14 and drain 16 is arbitrary, and alternately, source 14 and drain 16 may be interposed on sides of gate 12 opposite from those depicted in FIG. 1. Gate 12 is attached to a conductive line 18, shown interrupted at point 20. Conductive line 18 is, for example, connected to the output of a driver transistor (not shown) or to an external interface. Another connective line 22 joins gate 12 to a connective pad 24. Pad 24 connects gate 12 to circuits on other substrate layers of the IC (not shown).

Figure 2:
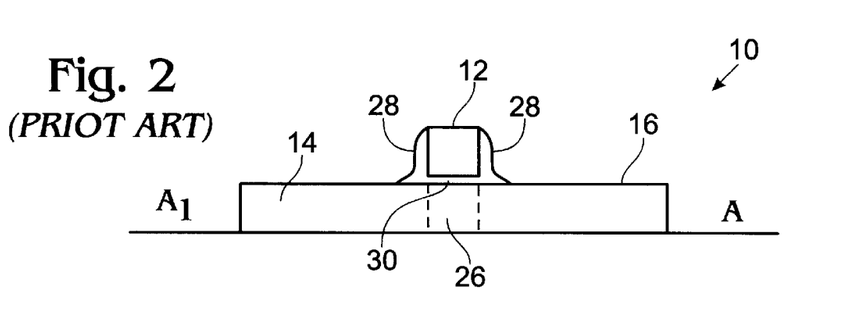

FIG. 2 is a cross-sectional view of transistor 10 depicted in FIG. 1 at cut-away along a plane represented by reference designators A-A$_1$. Source 14 and drain 16 are separated by a channel region 26 generally disposed between source electrode 14 and drain electrode 16, and beneath gate electrode 12. Source electrode 14, drain electrode 16, and channel region 26 are typically formed from a common piece of silicon. As is well known in the art, the characteristics of source 14 and drain 16 are formed through the implantation of doping impurities. The separation between source 14, drain 16, and channel region 26 is represented with dotted lines. Gate 12 has insulating gate sidewalls on both sides of gate electrode 12, and a gate insulating layer 30 underneath gate electrode 12. Sidewalls 28 and insulating layer 30 electrically insulate gate electrode 12 from source 14 and drain 16 electrodes.

Figure 3:
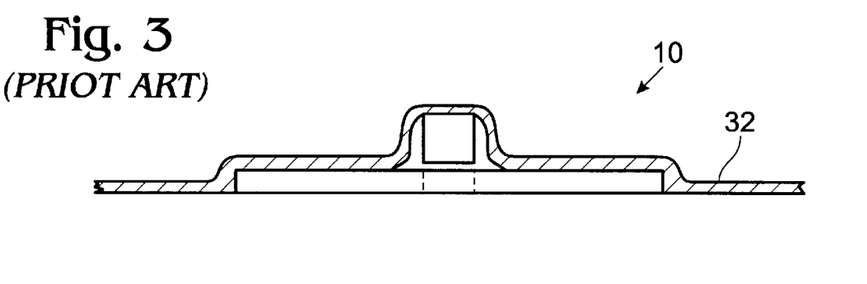

FIG. 3 illustrates transistor 10 of FIG. 2 covered with a layer of metal 32. Metal layer 32 has a substantially uniform thickness over gate 12, source 14, drain 16, sidewalls 28, and the region generally surrounding transistor 10. Metal layer 32 is deposited on transistor 10 for the purpose of forming a silicide surface on source 14, drain 16, and gate 12.

Figure 4:
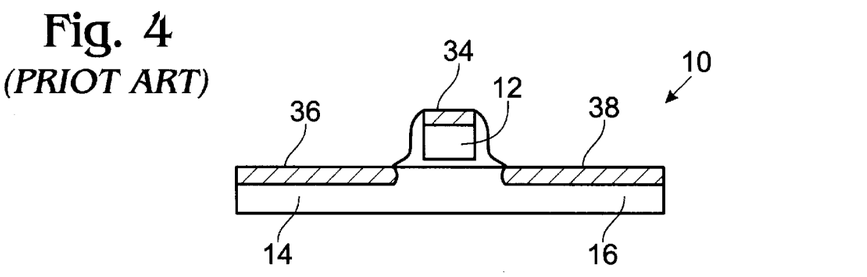

FIG. 4 illustrates transistor 10 of FIG. 3 after the formation of disilicide on the silicon surfaces. Metal layer 32, for example cobalt (Co), reacts with the silicon of electrodes 12, 14, and 16 under temperature to form a disilicide. A disilicide surface is desirable because of its increased conductivity. That is, the resistance across a disilicide surface is less than the resistance across a single-crystal silicon, or polysilicon, electrode surface. Disilicide surfaces decrease the impedance of IC interconnections to electrodes 12, 14, and 16 such as conductive lines and vias, and permit the IC device to operate at higher speeds.

FIG. 4 depicts a disilicide surface 34 covering gate 12, a disilicide surface 36 covering source 14, and a disilicide surface 38 covering drain 16. One problem with this method of forming disilicide surfaces 34, 36, and 38 is that portions of the silicon in electrodes 12, 14, and 16 must be used in the process. That is, the surface of electrodes 12, 14, and 16 are consumed in the formation of disilicide layers 34, 36, and 38. When the thickness of silicon in electrodes 12, 14, and 16 begins to approach approximately 500 Å, silicon stability become an issue. Relatively thin source 14, and drain 16 electrodes are desirable to minimize the size of channel region 26 and the overall size of transistor 10, therefore, the practical use of salicidation on thin electrodes has been limited. The present invention was developed to form disilicide layers on silicon electrodes without consuming the silicon in the electrodes so silicide can be applied to even relatively thin electrodes.

Figure 5:
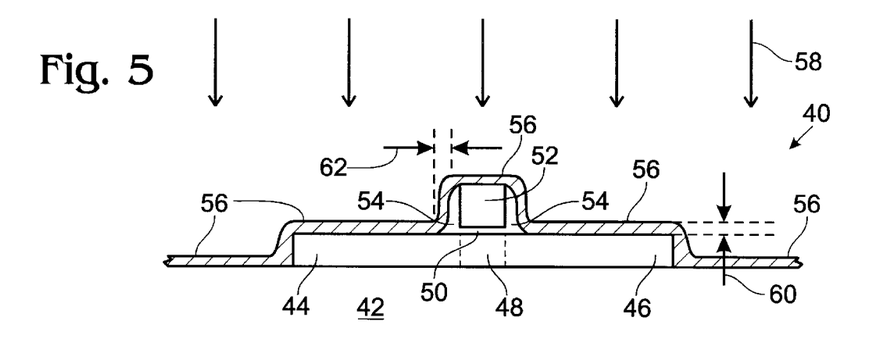
FIGS. 5 and 6 illustrate steps in the formation of an integrated circuit structure covered with different thicknesses of silicide, formed during the production of an MOS transistor.
Figure 6:
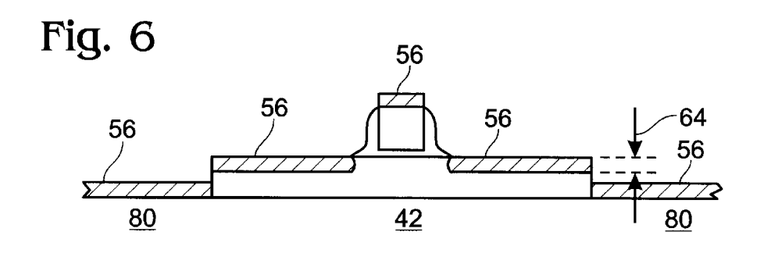

FIGS. 5 and 6 illustrate steps in the formation of an integrated circuit structure covered with different thicknesses of silicide, formed during the production of an MOS transistor. Alternately, FIGS. 5 and 6 depict steps in the silicidation of a completed MOS transistor. A MOS transistor is the most typical form of an IC structure, as used herein. The term "IC structure", therefore, generally refers to a MOS transistor that is in the process of fabrication. FIG. 5 illustrates a cross-sectional view of IC structure 40, similar to the cross-section view of prior art transistor 10 in FIG. 2. IC structure 40 comprises a substrate 42 including insulating material in an active region where the transistor is formed. Substrate 42 is typically an oxide, such as an oxide of silicon. IC structure 40 also comprises a source 44 and drain 46 electrode overlying substrate 42. Source 44 and drain 46 electrodes are formed from silicon implanted with doping impurities which are diffused into the silicon to form either n-type or p-type semiconductor material. Source 44 and drain 46 electrodes are separated by a silicon channel region 48, and are typically formed from a common piece of silicon. The boundaries between source 44, drain 46, and channel region 48 are approximately differentiated in FIG. 5 by dotted lines. IC structure 40 also comprises a gate, including a gate insulation layer 50 centrally disposed over channel region 48, a gate electrode 52 overlying gate insulation layer 50, and gate insulation sidewalls 54 overlying gate insulation layer 50, generally surrounding gate electrode 52. The gate insulation electrically isolates gate electrode 52 from source 44 and drain 46 electrodes.

IC structure 40, as depicted in FIG. 5, is being formed from a SIMOX wafer. SIMOX is an acronym for "Separation by IMplanted OXygen" and provides a suitably thin layer of single-crystal silicon for source 44 and drain 46 electrodes. The processing of IC structure 40 includes isolating an active area where the device is formed by removing portions of the silicon layer forming electrodes 44 and 46 down to substrate 42. A gate is formed centrally on the active area by suitable photolithographic and etching steps to create a gate electrode 52 and insulation layers 50 and 54. For the purposes of the present invention, the designation of regions 44 and 46 as source and drain, respectively, is arbitrary and may be reversed. In other words, region 46 may be designated the source electrode region and 44 the drain electrode region, or visa versa.

IC structure 40 also comprises a metal-silicide layer 56 formed from the deposition of silicide in a collimated path which extends generally perpendicular to source 44, drain 46, and gate 52 electrodes, and parallel to gate sidewalls 54. The direction of the collimated path is indicated by the series of arrows with the reference designator 58. Silicide layer 56 has a first thickness 60 of silicide on electrodes 44, 46, and 52, and a second, smaller, thickness 62 on gate sidewalls 54. First thickness 60 and second thickness 62 are depicted by the dotted lines extending from silicide layer 56. The isotropic removal of a predetermined thickness of silicide layer 56 greater than second thickness 62, and less than first thickness 60, in subsequent processing steps, results in a third thickness 64 (not shown in this Fig.) of silicide covering said source 44, drain 46, and gate 52 electrodes to improve the conductivity of the electrodes.

Collimated, or directional, deposition is defined herein as a physical deposition which deposits material in substantially a straight line from a source, and through a collimator, perpendicular to a target surface. The most common means of accomplishing this kind of silicide deposition is by vacuum evaporation using e-beam evaporation from separate metal and silicon sources. Alternately, the same result is obtained from laser evaporation, flash evaporation, or beam sputtering. In another alternative, collimation is achieved by separating the source and target by a distance large enough that arriving material is substantially perpendicular to the target surface. In general, a more uniform directional deposition is obtained in a low pressure environment. Therefore, low pressure ion beam sputtering provides a better collimated deposition than direct current (DC), radio frequency (RF), or magnetron sputtering.

FIG. 6 illustrates IC structure 40 of FIG. 5 with silicide layer 56 having third thickness 64 on electrodes 44, 46, and 52. After an isotropic etch of silicide layer 56, the thickness of silicide layer 56 covering source 44, drain 46, gate 52, and the area generally surrounding IC structure 40, is substantially the same. Second thickness 62 shown overlying sidewalls 54, in FIG. 5, is removed by the isotropic etch.

In a preferred embodiment, IC structure 40 is a completed MOS transistor additionally comprising a first metal-disilicide layer (not shown) having approximate third thickness 64 overlying source 44, drain 46, and gate 52 electrodes. The first disilicide layer is formed by isotropically etching a predetermined thickness from silicide layer 56 first thickness 60. As above in FIG. 5, first thickness 60 is formed as a result of depositing metal-silicide in a collimated path 58 generally perpendicular to electrodes 44, 46, and 52. The first metal-disilicide layer is silicide layer 56 of FIG. 6 following an annealing process.

The completed transistor also comprises interim metal-silicide layer 56 having second thickness 62 overlying gate sidewall insulation 54 in FIG. 5. As shown in FIG. 5, second thickness 62 is formed from the deposition of silicide in collimated path 58 generally parallel to gate sidewalls 54. Interim layer 56 is removed by isotropically etching the predetermined thickness from second thickness 62, with the predetermined thickness being greater than second thickness 62, but less than first thickness 60, as shown in FIG. 6. The collimated deposition, and isotropic etching, permit the selective silicidation of source 44, drain 46, and gate 52 electrodes.

In one embodiment, MOS transistor 40 is formed on a SIMOX wafer including a layer of oxide film, and a layer of single-crystal silicon film overlying the oxide film. Source 44 and drain 46 electrodes are formed from the single-crystal silicon film layer, and substrate 42 is formed from the oxide layer, whereby the device isolation is increased, parasitic capacitance reduced, and leakage current decreased.

Referring again to FIG. 5, the IC structure 40 has first silicide thickness 60 generally in the range between 100 and 500 Å, and second silicide thickness 62 is generally in the range between 20 and 100 Å. Referring to FIG. 6, third silicide thickness 64 is generally in the range between 80 and 400 Å.

Figure 7:
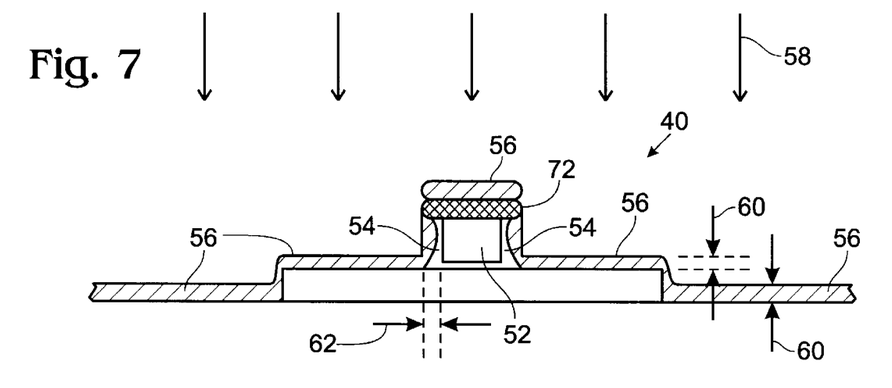
FIGS. 7 through 9 illustrate steps in the formation of silicide covered electrodes with the use of a gate overhang structure.
Figure 8:
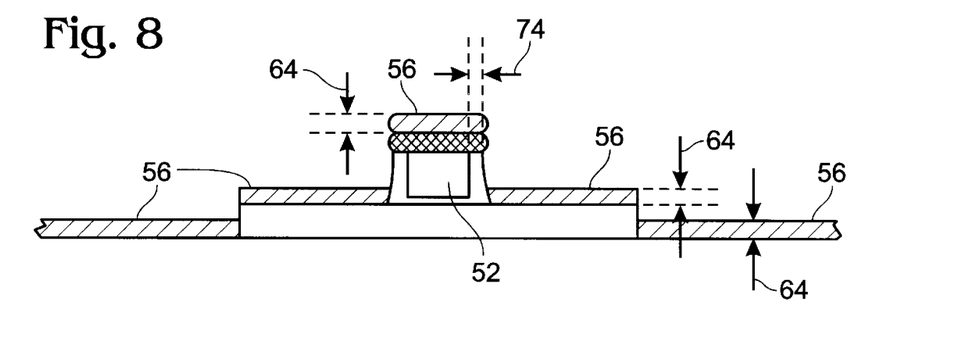
Figure 9:
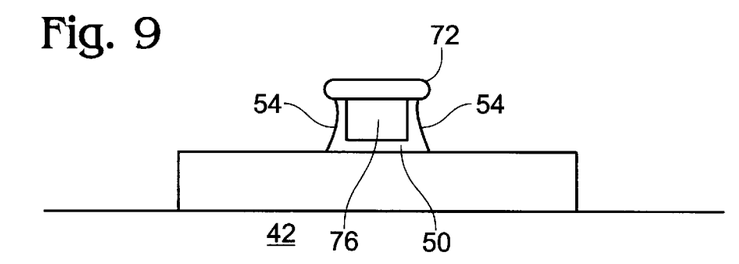

FIGS. 7 through 9 illustrate steps in the formation of silicide covered electrodes with the use of a gate overhang structure. FIG. 7 depicts IC structure 40 having an overhang structure 72 overlying gate electrode 52. Overhang structure 72 extends beyond gate electrode 52 to shelter gate sidewalls 54 from the deposition of silicide when silicide is deposited in a collimated path generally perpendicular to overhang structure 72 and parallel to gate sidewalls 54. As in FIG. 5, the direction of the collimated path is depicted with arrows having the reference designator 58. The addition of overhang structure 72 makes the deposition of silicide on source 44 and drain 46 electrodes more selective. That is, while first thickness 60 of silicide layer 56 remains substantially the same as first thickness 60 in FIG. 5, second thickness 62 in FIG. 7 has been reduced with the use of overhang structure 72. With the use of overhang structure 72, second thickness 62 is generally in the range between 0 and 50 Å. Since second thickness 62 has been reduced, the isotropic etch of a predetermined thickness is also reduced and simplified which, in turn, makes third thickness 64 greater to improve the thermal stability and sheet resistance of silicide layer 56 on electrodes 44, 46, and 52.

FIG. 8 illustrates IC structure 40 of FIG. 7 after a predetermined thickness of silicide layer 56 has been isotropically etched away. The distance that overhang structure 72 extends beyond gate electrode 52 is depicted with dotted lines and has the reference designator 74. Overhang structure 72 extends beyond gate electrode 52 a distance 74 generally in the range between 200 and 1000 Å.

FIG. 9 illustrates a polycide gate electrode overhang structure. Gate electrode 52 includes a layer of polysilicon 76 overlying gate insulation layer 50. Overhang structure 72 is a layer of silicide overlying polysilicon layer 76, whereby the conductivity of gate electrode 52 is further increased. It is generally true that a thicker layer of silicide decreases surface resistance.

A method of forming overhang structure 72 is presented below. For example, after the step of gate oxidation to form insulation layer 50, and the deposition of polysilicon layer 76, tungsten silicide is deposited by LPCVD (low pressure chemical vapor deposition) blanket deposition. At this point in the process silicide layer 72 is stacked over polysilicon layer 76. The next step in the process is to apply a photo mask, and then anisotropically etch the gate electrode stack to the end point. During the etching process the etch condition is adjusted so that there is a slight sideways etch of polysilicon layer 76. This can be accomplished, for example, by increasing the flow rate of a fluorine containing gas, such as $SF_6$ or $NF_3$. Alternately, the pressure in the environment can be increased to make the etch less anisotropic, or the bias voltage of the bottom electrode can be reduced. Finally, the etched stack structure is oxidized to form sidewalls 54 and to make overhang structure 72 more pronounced on the edges extending over, and beyond, polysilicon layer 76. Oxide, remaining after this step on the edges of overhang structure 72, also adds to distance 74 that overhang 72 extends beyond gate electrode 52. Sidewall oxide 54 is also formed by an additional oxide deposit, such as plasma enhanced chemical vapor deposition and a spacer etch stop.

Figure 10:
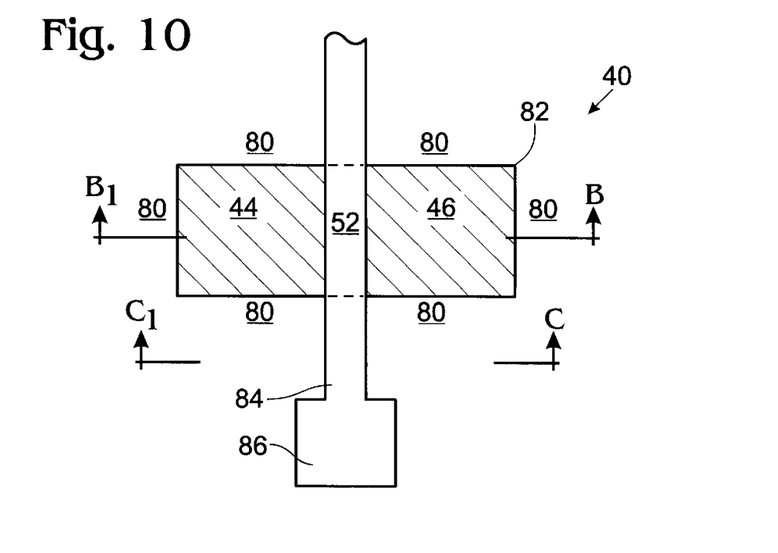
FIGS. 10 through 12 illustrate steps in protecting the silicide covered electrodes of FIG. 6 from etching in subsequent IC processes.
Figure 11:
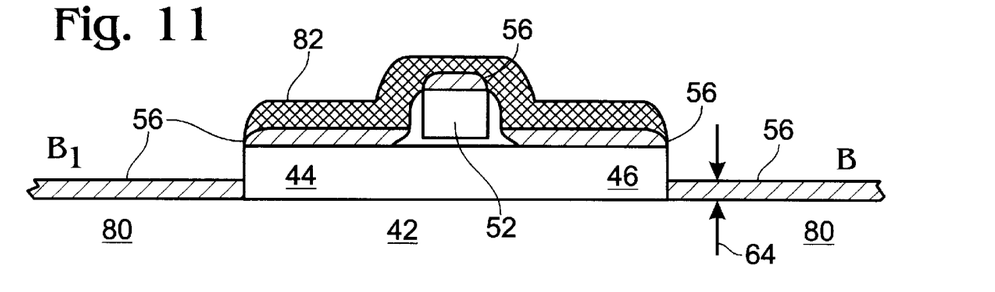
Figure 12:
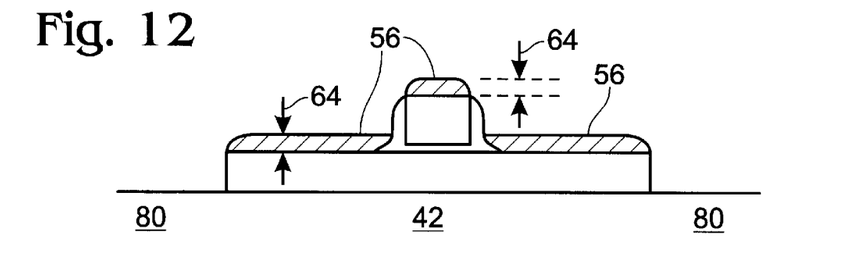

FIGS. 10 through 12 illustrate steps in protecting the silicide covered electrodes of FIG. 6 from etching in subsequent IC processes. FIG. 10 illustrates a top view of IC structure 40 depicted in FIGS. 5 and 6. Beneath source 44, drain 46, and gate 52 is substrate 42 which includes a field area 80 of insulating material generally surrounding IC structure 40. FIG. 11 illustrates a cross-sectional view of IC structure 40 in FIG. 10 with the cut-away at a plane depicted by reference designators B-$B_1$. Referring again to FIG. 6, third thickness 64 of metal-silicide 56 overlies field area 80, as well as electrodes 44, 46, and 52. In subsequent process steps a mask 82 is applied to cover electrodes 44, 46, and 52.

FIG. 11 illustrates mask 82 overlying electrodes 44, 46, and 52. In FIG. 10, mask 82 is the area of IC structure 40 covered with hatched lines. Etching IC structure 40 to remove any remaining silicide 56 overlying field area 80 leaves only the masked areas covered with silicide. The formation of silicide layer 56 on electrodes 44, 46, and 52 is desirable to increase the conductivity of these electrodes, however, silicide layer 56 is not desirable in the areas overlying field area 80. Field area 80 is intended to electrically insulate IC structure 40 from other IC structures and transistors in the IC. Metal-silicide layer 56 overlying field area 80 must be removed to prevent unintended shorts, or conduction paths between various IC structures.

FIG. 12 illustrates the IC structure 40 of FIG. 11 after an etch process to remove silicide layer 56 from field area 80, and after mask 82 has been removed from IC structure 40. Silicide layer 56 remains overlying electrodes 44, 46, and 52. When IC structure 40 is a MOS transistor, an interim layer of disilicide (not shown) having approximate third thickness 64 overlies field area 80 in FIG. 6. The interim disilicide layer is formed by isotropically etching a predetermined thickness from silicide layer 56 first thickness 60. First thickness 60 is formed as a result of depositing metal-silicide in a collimated path generally perpendicular to field area 80. Subsequent process steps of masking transistor electrodes 44, 46, and 52 (FIGS. 10 and 11), and etching transistor 40 to remove remaining silicide 56 overlying field areas 80, leave only masked areas covered with silicide, as shown in FIG. 12.

Referring again to FIG. 10, a conductive line 84 is connected to gate electrode 52 and to a conductive pad 86. In this manner, an electrode of IC structure 40 is connected to another region in the IC through conductive pad 86 and conductive line 84. In the examples presented below, conductive line 84 is connected to gate electrode 52. Alternately, conductive line 84 is connected to source 44 or drain 46.

Figure 13:
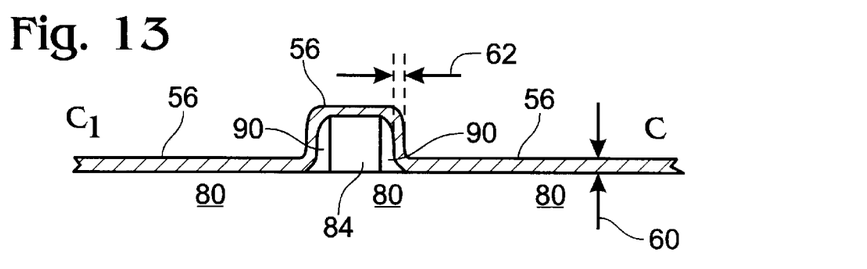
FIG. 13 illustrates a cross-section view of the device in FIG. 10 with a cut-out away view defined along the plane having the reference designators C-C$_1$.

FIG. 13 illustrates a cross-section view of the device in FIG. 10 with a cut-out away view defined along the plane having the reference designators C-$C_1$. Sidewalls 90 generally surround conductive line 84 and act to electrically isolate conductive line 84. Silicide layer 56 covers field area 80, as well as conductive line 84. Initially, silicide layer 56 has first thickness 60 due to a collimated deposition generally perpendicular to the above named surfaces, and second thickness 62 along sidewalls 90 where the collimated deposition is generally parallel to sidewalls 90.

Figure 14A:
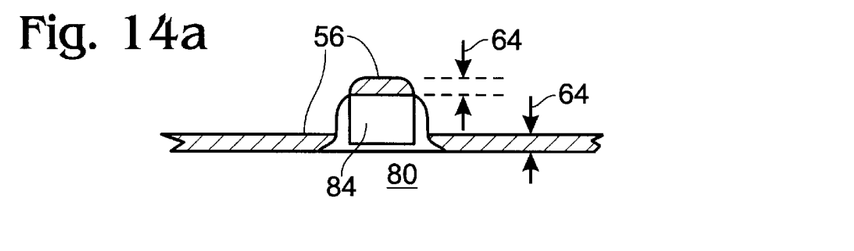
FIGS. 14a and 14b illustrate the conductive line of FIG. 13 after two etch processes to remove unwanted silicide from the field area.
Figure 14B:
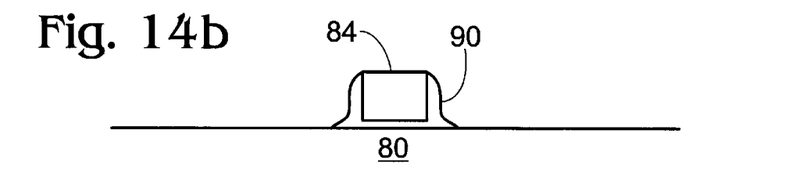

FIGS. 14a and 14b illustrate conductive line 84 of FIG. 13 after two etch processes to remove unwanted silicide from field area 80. First, in FIG. 14a an isotropic etch is performed to form third thickness 64 of silicide layer 56 overlying field area 80 and conductive line 84, and to remove second thickness 62 overlying conductive line sidewalls 90. Second, in FIG. 14b, after applying mask 82 to electrodes 44, 46, and 52 (see FIG. 11), an etch is performed to remove the remaining layer of silicide 56 overlying field area 80. In this second process step silicide layer 56 overlying conductive line 84 is also removed. Thus, conductive line 84 is left substantially in the same state as before the silicide process. That is, although the above described silicidation process increases the conductivity of IC structure 40, the conductivity of connecting conductive line 84 is left unimproved. To remedy this problem with conductive lines, the present invention introduces to use of a polycide conductive line below.

Figure 15:
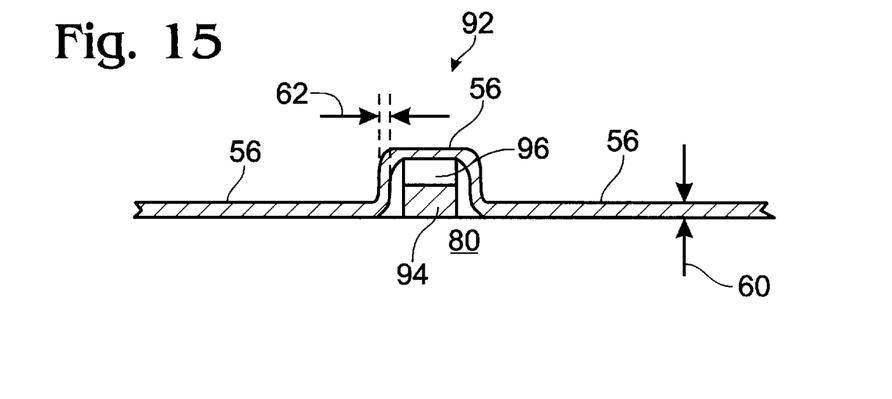
FIG. 15 illustrates the IC structure, or MOS transistor, of FIG. 10 in which the field area includes a polycide conductive line overlying the field area to connect an electrode of the IC structure to another region in the IC.

FIG. 15 illustrates IC structure 40 of FIG. 10 in which field area 80 includes a polycide conductive line 92 overlying field area 80 to connect an electrode of IC structure 40 to another region in the IC. Conductive line 92 includes a layer of polysilicon 94 overlying field area 80, and a layer of silicide 96 overlying polysilicon conductive line layer 94. FIG. 15 also illustrates conductive line 92 and field area 80 being covered with silicide layer 56 having a first thickness 60 and a second thickness 62 due to the collimated deposition method described above in FIG. 13. Silicide layer 96 remains overlying conductive line polysilicon layer 94, even after the IC is etched to remove, in subsequent process steps, silicide from field area 80, so that conductive areas of the IC, including conductive line 92, as well as source 44, drain 46, and gate 52 electrodes, are covered with a layer of silicide to increase conductivity.

Figure 16A:
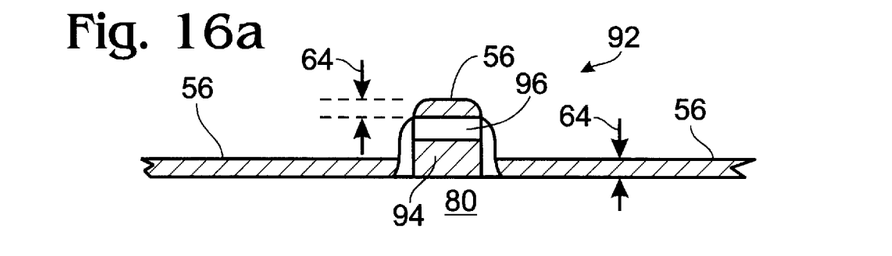
FIGS. 16a and 16b illustrate the conductive line of FIG. 15 following etch processes to remove unwanted silicide from the field area.
Figure 16B:
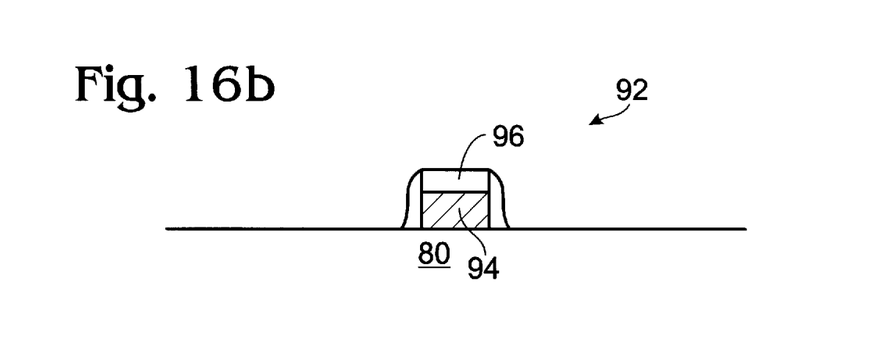

FIGS. 16a and 16b illustrate conductive line 92 of FIG. 15 following etch processes to remove unwanted silicide from field area 80. Silicide layer 56 is removed from conductive line 92 and field area 80 in two separate etch processes. First, in FIG. 16a third thickness 64 of silicide layer 56 is formed over silicide layer 96 and field area 80 after a collimated deposition of silicide and isotropic etch. Second, in FIG. 16b an etch step is performed to strip away third thickness 64.

When IC structure 40 is a step in the process to complete a MOS transistor, an interim disilicide layer (not shown) overlies conductive line 92 in FIG. 16a. The interim disilicide layer results from annealing silicide third thickness 64. However, as shown in FIG. 16b, a layer of silicide 96 remains overlying conductive line polysilicon layer 94, even after transistor 40 is etched to remove silicide 56 from field area 80, so that conductive areas of transistor, 40, including conductive line 92, as well as source 44, drain 46, and gate 52 electrodes are covered with a layer of silicide 56 to increase conductivity. That is, polycide conductive line 92 retains its original layer of silicide 96. This selective removal of silicide from conductive polycide line 92 is enhanced with the use of different silicide materials, and adjusting the etch chemistries to increase etch selectivity.

Figure 17:
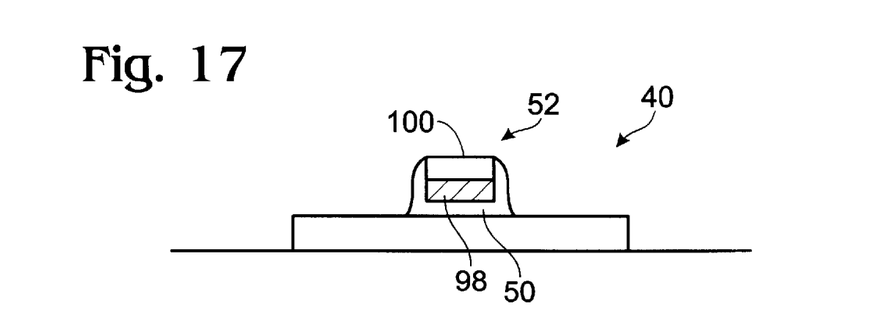
FIG. 17 illustrates an IC structure, or MOS transistor, with a polycide gate electrode.

FIG. 17 illustrates IC structure 40 with a polycide gate electrode 52. Polycide electrode 52 includes a layer of polysilicon 98 overlying gate insulation layer 50, and a layer of silicide 100 overlying polysilicon layer 98. Typically, polycide gate electrode 52 is unnecessary as electrodes 44, 46, and 52 are masked (see FIG. 10) as silicide layer 56 is removed from surrounding field area 80. However, polycide gate electrode 52 has further enhanced conductivity characteristics, as it is generally true that a thicker layer of silicide has less resistance.

Figure 18:
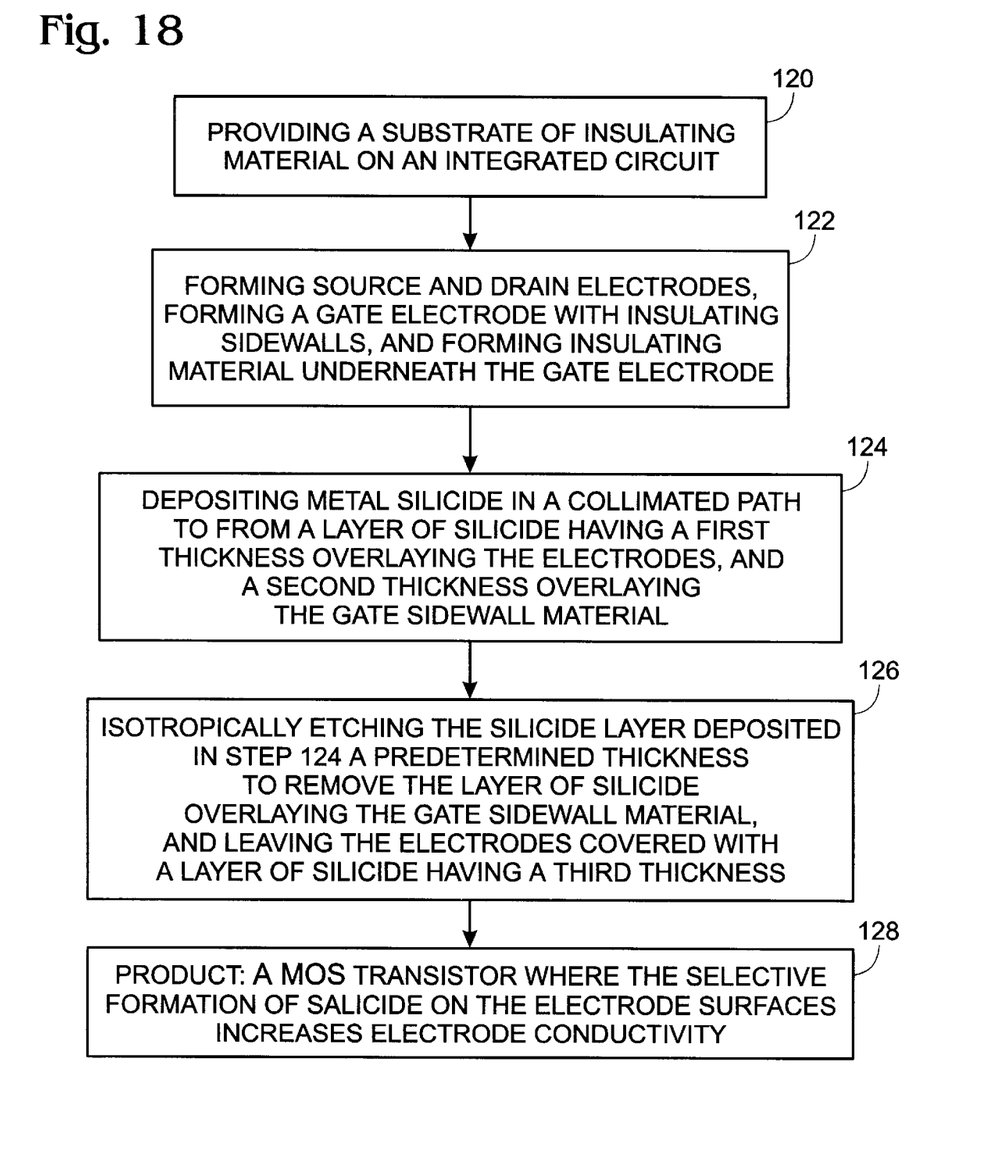
FIG. 18 illustrates steps in the method of forming an MOS transistor overlying a substrate of insulating material on an IC.

FIG. 18 illustrates steps in the method for forming a MOS transistor overlying a substrate of insulating material on an IC. Step 120 provides a substrate of insulating material on an integrated circuit. Step 122 forms source and drain electrodes of silicon overlying the substrate, forms a gate electrode with insulating sidewalls between the source and drain electrodes, and forms insulating material underneath the gate electrode, whereby the insulation electrically isolates the gate electrode from the source and drain electrodes.

Step 124 deposits metal-silicide in a collimated path, with the path generally extending perpendicular to the source, drain, and gate electrodes, and parallel to the gate sidewalls. The silicide is selectively applied to the transistor to form a layer of silicide having a first thickness overlying the electrodes and a second thickness, less than the first thickness, overlying the gate sidewall insulation material. Step 126 isotropically etches the silicide layer deposited in Step 124 a predetermined thickness, greater than the second thickness but less than the first thickness, to remove a layer of silicide overlying the gate sidewall insulation material, and leaving the electrodes covered with a layer of silicide having a third thickness. Step 128 provides a product; an MOS transistor where the selective formation of silicide on the electrode surfaces increases electrode conductivity.

In one embodiment, an overhang structure overlies gate electrode, the overhang structure extending beyond the gate electrode to shelter the gate sidewalls from the deposition of silicide when silicide is deposited in a collimated path generally perpendicular to the overhang and parallel to the gate sidewalls. In this manner, the deposition of silicide on the source and drain electrodes is made more selective. The overhang structure extends beyond the gate electrode a distance generally in the range between 200 and 1000 Å, and the second thickness is generally in the range between 0 and 50 Å.

Preferably, a further step is provided, after Step 126, of annealing the silicide layer having a third thickness formed in Step 126 to create a disilicide layer having approximately a third thickness. The selective deposition of silicide on the electrodes increases the conductivity of the source, drain, and gate electrode surfaces. Step 126 includes forming disilicide with a rapid thermal annealing (RTA) process at a temperature generally in the range between 500° and 900° C. The RTA process of forming disilicide is completed in a period of time generally in the range between 10 and 50 seconds.

The silicide layer in Step 124 is either a uniform layer of a single metal-silicide, for example cobalt silicide, or, alternatively, is made up of more than one layer of silicidation material. For example, the silicide layer might include a lower layer of Ti silicide, and an upper layer of Co silicide. Other layered, or alloyed, combinations of suitable silicidation materials for use in creating silicide contacts on semiconductor electrodes will occur to those skilled in the art.

The anneal is carried out at a temperature, and for a duration, which reacts the silicidation material to yield a disilicide. Disilicide phase silicide is $XSi_2$ where X is the selected silicidation material. The silicide metal, represented by X, is selected from the group consisting of Co, Ti, Ni, W, Mo, Ta, combination of Ti with Co and Ni, and other refractory metal.

It will be readily understood that if a temperature near the lower end of the specified range for the RTA is used, for example, 500° C., the duration should be longer than if a higher temperature in the range is used, for example, 900° C.

The substrate includes a field area of insulating material generally surrounding the transistor. Step 124 includes depositing a first thickness of metal-silicide on the field area in a collimated path, with the path generally extending perpendicular to the field area. Step 126 includes isotropically etching the silicide layer overlying the field area deposited in Step 124 a predetermined thickness, greater than the second thickness but less than the first thickness, leaving the field area covered with a layer of silicide having a third thickness. Further steps anneal the silicide overlying the field area to form a disilicide layer, mask the active areas of the transistor including the source, drain, and gate electrodes, and etch the silicide layer from the field area. The silicide in the field area is removed to prevent unintended conduction paths across the IC.

In a preferred embodiment, a polycide conductive line overlies the field area to connect an electrode of a transistor to another region of the IC. The conductive line includes a layer of polysilicon overlying the field area, and a first layer of silicide overlying the polysilicon layer. Step 124 includes depositing a first thickness of metal-silicide on the conductive line in a collimated path, with the path generally extending perpendicular to the conductive line. Step 126 includes isotropically etching the silicide layer overlying the conductive line deposited in Step 124 a predetermined thickness, greater than the second thickness but less than the first thickness, leaving the first layer of silicide (originally on the conductive line) covered with a layer of silicide (from the directional deposition) having a third thickness. Further steps include annealing both layers of silicide overlying the polysilicon layer of the conductive line, and etching the third thickness of silicide overlying the conductive line to reveal the first silicide layer. Conductive surfaces of the transistor, including the electrodes and the conductive line, remain covered with silicide to increase conductivity. The selective removal of different layers of silicide is aided with the use of silicides derived from different metals which react differently to the etchants used.

The isotropic etch process of Step 126 is a process selected from the group consisting of a wet solution etching process, and a dry etching process in a chlorine containing plasma at high pressure, whereby a minimum of polymer is formed on the gate sidewalls. Removal of silicidation material is accomplished by selectively etching the wafer using a wet etch, or similar process, which etches silicidation material, but not silicon compounds of the silicidation material. For example, a suitable etchant for titanium silicide is $NH_4OH/H_2O_2$. Dilute solutions of HF can also be used for titanium silicide and tantalum silicide. An alternative term used herein for the etchant used in this first etching step is "silicidation material etchant," which refers to any suitable etching compound for removing silicidation material from surfaces.

In one embodiment, the source and drain electrodes are formed from bulk silicon deposited on a bulk substrate, and the source and drain electrodes are wells in the bulk silicon formed through ion implantation, followed by diffusion. That is, the method of the present invention can alternatively be performed on devices fabricated in bulk silicon instead of a SIMOX wafer. A bulk silicon wafer (not shown) has an appropriately doped p-well or n-well region in the silicon. An active area is isolated and defined by field oxide area which are conventionally formed using well-known processing steps. A gate structure, like the gate structure shown in FIG. 5, is provided centrally on active area overlying channel region 48. Typically, a light implantation of doping materials is directed at the silicon substrate before the gate sidewalls 54 are formed to create lightly doped, or LDD, junction regions adjacent the device channel region 48. Then, after formation of sidewalls 54, a heavier dose of appropriate doping impurities are implanted into the source/drain electrode regions. Further details of the steps required for the structures are well known to those skilled in the art and will not be further described herein. Lightly doped regions, similar to the regions described above for bulk silicon, are also formed selectively in SIMOX wafer devices, but those regions have been omitted from FIG. 5 and the other figures for simplicity.

In another embodiment, the source and drain electrodes are raised structures formed from epitaxial silicon overlying an active area on an oxide substrate. Both the silicidation, and the raising of the source and drain electrodes, permit a reduction in the channel length between electrodes, and therefore, a smaller sized transistor.

The present invention permits good control of the thickness of single-crystal silicon by essentially eliminating the consumption of silicon during the RTA, a vast improvement over prior art salicidation methods. That allows for the formation of ultra-thin source/drain junction regions, on the order of 100–200 Å in thickness. The exact processes for controlling the thickness of the source/drain electrodes should be empirically derived before commercial chip fabrication is undertaken. The precise temperature and duration of the anneals, and the desired thickness of electrodes and of the overlying silicide can readily be controlled by adjusting the duration and temperature of the anneals. Alternative embodiments are possible within the scope of the present invention. As noted above, the description focuses on MOS transistors formed on SIMOX substrates but the process is equally suitable for use forming active devices in bulk silicon. Other variations to the method within the scope of the present invention will occur to those skilled in the art.

What is claimed is:

1. A method of forming a MOS transistor overlying a substrate of insulating material on an IC comprising the steps of:
    a) forming source and drain electrodes of silicon overlying the substrate, forming a gate electrode with insulating sidewalls between the source and drain electrodes, and forming insulation material underneath the gate electrode, whereby the insulation electrically isolates the gate electrode from the source and drain electrodes;
    b) depositing metal-silicide in a collimated path, with the path generally extending perpendicular to the source, drain, and gate electrodes, and parallel to the gate sidewalls, the silicide being selectively applied to the transistor to form a layer of silicide having a first thickness overlying the electrodes and a second thickness, less than the first thickness, overlying the gate sidewall insulation material; and
    c) isotropically etching the silicide layer deposited in step b) a predetermined thickness, greater than the second thickness but less than the first thickness, to remove the layer of silicide overlying the gate sidewall insulation material, and leaving the electrodes covered with a layer of silicide having a third thickness, whereby the selective formation of silicide on the electrode surfaces increases electrode conductivity.

2. A method as in claim 1 in which an overhang structure overlies the gate electrode, the overhang structure extending beyond the gate electrode to shelter the gate sidewalls from the deposition of silicide when silicide is deposited in a collimated path generally perpendicular to the overhang and parallel to the gate sidewalls, whereby the deposition of silicide on the source and drain electrodes is made more selective.

3. A method as in claim 2 in which the overhang structure extends beyond the gate electrode a distance generally in the range between 200 and 1000 Å, and in which the second thickness is generally in the range between 0 and 50 Å.

4. The method as in claim 1 including the further step of:
    d) annealing the silicide layer having a third thickness formed in step c) to create a disilicide layer having approximately a third thickness, whereby the selective formation of silicide on the electrodes increases the conductivity of the source, drain, and gate electrode surfaces.

5. A method as in claim 4 in which step d) includes forming disilicide with a rapid-thermal-annealing (RTA) process at a temperature generally in the range between 500° and 900° C.

6. A method as in claim 5 in which the RTA process of forming disilicide in step d) is completed in a period of time generally in the range between 10 and 50 seconds.

7. A method as in claim 1 wherein the substrate includes a field area of insulating material generally surrounding the transistor, in which step b) includes depositing a first thickness of metal-silicide on the field area in a collimated path, with the path generally extending perpendicular to the field area, in which step c) includes isotropically etching the silicide layer overlying the field area deposited in step b) a predetermined thickness, greater than the second thickness but less than the first thickness, leaving the field area covered with a layer of silicide having a third thickness, in which step d) includes annealing the silicide overlying the field area to form a disilicide layer, and including the further steps of:

e) masking the active areas of the transistor including the source, drain, and gate electrodes; and f) etching the silicide layer from the field area, whereby silicide in the field area is removed to prevent unintended conduction paths across the IC.

8. A method as in claim 7 in which a polycide conductive line overlies the field area to connect an electrode of the transistor to another region of the IC, the conductive line including a layer of polysilicon overlying the field area, and a first layer of silicide overlying the polysilicon layer, in which step b) includes depositing a first thickness of metal-silicide on the conductive line in a collimated path, with the path generally extending perpendicular to the conductive line, in which step c) includes isotropically etching the silicide layer overlying the conductive line deposited in step b) a predetermined thickness, greater than the second thickness but less than the first thickness, leaving the first layer of silicide covered with a layer of silicide having a third thickness, in which step d) includes annealing both layers of silicide overlying the polysilicon layer of the conductive line, and in which step f) includes etching the third thickness of silicide overlying the conductive line to reveal the first silicide layer, whereby the conductive surfaces of the transistor, including the electrodes and the conductive line, remain covered with silicide to increase conductivity.

9. A method as in claim 1 in which the first thickness is generally in the range between 100 and 500 Å, the second thickness is between 20 and 100 Å, and in which the third thickness is in the range between 80 and 400 Å.

10. A method as in claim 1 in which the isotropic etch process of step c) is a process selected from the group consisting of a wet solution etching process, and a dry etching process in a chlorine-containing plasma at high pressure, whereby a minimum of polymer is formed on the gate sidewalls.

11. A method as in claim 1 in which the source and drain electrodes are formed from bulk silicon deposited on a bulk substrate, and in which the source and drain electrodes are wells in the bulk silicon formed through ion implantation, followed by diffusion.

12. A method as in claim 1 in which the source and drain electrodes are raised structures formed from epitaxial silicon overlying an active area on an oxide substrate, whereby both the salicidation, and the raising of the source and drain electrodes, permit a reduction in the channel length between electrodes, and therefore, a smaller sized transistor.

13. A method as in claim 1 in which the deposited metal-silicide is selected from the group consisting of Co, Ti, Ni, W, Mo, Ta, combinations of Ti with Co and Ni, and other refractory metals.

14. A method as in claim 1 in which the gate electrode is a polycide electrode including a layer of polysilicon overlying the gate insulation layer, and a layer of silicide overlying the layer of polysilicon.

* * * * *